US010886670B2

(12) United States Patent
Fischeneder et al.

(10) Patent No.: US 10,886,670 B2
(45) Date of Patent: Jan. 5, 2021

(54) PCB-BASED CONNECTOR DEVICE

(71) Applicant: AT&S AUSTRIA TECHNOLOGIE & SYSTEMTECHNIK AKTIENGESELLSCHAFT, Leoben (AT)

(72) Inventors: Martin Fischeneder, Vienna (AT); Markus Kastelic, Zeltweg (AT); Markus Leitgeb, Trofaiach (AT); Nick Renaud-Bezot, Leoben (AT)

(73) Assignee: AT&S AUSTRIA TECHNOLOGIE & SYSTEMTECHNIK AKTIENGESELLSCHAFT, Leoben (AT)

( * ) Notice: Subject to any disclaimer, the term of this patent is extended or adjusted under 35 U.S.C. 154(b) by 105 days.

(21) Appl. No.: 15/119,839

(22) PCT Filed: Feb. 18, 2015

(86) PCT No.: PCT/EP2015/053446
§ 371 (c)(1),
(2) Date: Aug. 18, 2016

(87) PCT Pub. No.: WO2015/124646
PCT Pub. Date: Aug. 27, 2015

(65) Prior Publication Data
US 2017/0062992 A1    Mar. 2, 2017

(30) Foreign Application Priority Data

Feb. 19, 2014    (EP) ..................................... 14290041

(51) Int. Cl.
*H01R 13/66*      (2006.01)
*H05K 1/11*      (2006.01)
(Continued)

(52) U.S. Cl.
CPC ......... *H01R 13/665* (2013.01); *H01R 12/721* (2013.01); *H01R 12/732* (2013.01);
(Continued)

(58) Field of Classification Search
CPC .... H01R 12/52; H01R 12/718; H01R 12/732; H01R 12/721; H01R 13/665;
(Continued)

(56) References Cited

U.S. PATENT DOCUMENTS 5,219,292 A * 6/1993 Dickirson ............... H01R 9/096
                                                      439/65
5,374,196 A    12/1994 Horine
(Continued)

FOREIGN PATENT DOCUMENTS

CN        101022698        8/2007
CN        100499961        6/2009
(Continued)

OTHER PUBLICATIONS

International Search Report and Written Opinion prepared by the European Patent Office dated Apr. 24, 2015, for International Application No. PCT/EP2015/053446.
(Continued)

*Primary Examiner* — Renee Luebke
*Assistant Examiner* — Paul D Baillargeon
(74) *Attorney, Agent, or Firm* — Sheridan Ross P.C.

(57) ABSTRACT

A connector device for connection with a counter piece for establishing a mechanical and electric connection, wherein the connector device comprises at least two printed circuit board elements each comprising an electrically insulating core and at least one comprising an electrically conductive structure at least partially on the respective electrically insulating core, and at least one embedded component embedded within the respective electrically insulating core
(Continued)

and electrically coupled to the respective electrically conductive structure, wherein the at least one electrically conductive structure is arranged at least partially on an exposed surface of the connector device and is configured for establishing the electric connection with the counter piece upon establishing the mechanical connection with the counter piece.

13 Claims, 8 Drawing Sheets

(51) Int. Cl.
    *H05K 1/14*      (2006.01)
    *H05K 1/18*      (2006.01)
    *H01R 12/72*      (2011.01)
    *H01R 12/73*      (2011.01)
    *H05K 3/46*      (2006.01)

(52) U.S. Cl.
    CPC ............ *H05K 1/117* (2013.01); *H05K 1/142* (2013.01); *H05K 1/185* (2013.01); *H05K 3/4697* (2013.01); *H05K 2201/042* (2013.01); *H05K 2201/09163* (2013.01); *H05K 2201/209* (2013.01)

(58) Field of Classification Search
    CPC ...... H01R 12/714; H05K 1/117; H05K 1/142; H05K 1/185; H05K 3/4697; H05K 2201/042; H05K 2201/09163; H05K 2201/209; H05K 1/184
    USPC .................................................. 439/620.22
    See application file for complete search history.

(56) References Cited

U.S. PATENT DOCUMENTS

| | | | |
|---|---|---|---|
| 5,515,604 A | 5/1996 | Horine et al. | |
| 6,239,380 B1 * | 5/2001 | Drussel | H01L 21/481 174/250 |
| 6,981,878 B1 * | 1/2006 | Herbert | H02M 7/003 439/65 |
| 7,232,315 B2 | 6/2007 | Uchida et al. | |
| 7,944,707 B2 * | 5/2011 | Hung | H01L 23/13 174/260 |
| 8,941,013 B2 * | 1/2015 | Arnold | H01R 12/714 174/258 |
| 2001/0053565 A1 * | 12/2001 | Khoury | H05K 3/366 438/121 |
| 2006/0292898 A1 * | 12/2006 | Meredith | H05K 1/184 439/65 |
| 2007/0176613 A1 | 8/2007 | Ogawa et al. | |
| 2007/0270040 A1 * | 11/2007 | Jang | G06K 19/077 439/660 |
| 2014/0017940 A1 * | 1/2014 | Chen | H01R 13/6477 439/607.02 |
| 2015/0156882 A1 * | 6/2015 | Bong | H01L 24/11 257/690 |
| 2018/0151270 A1 * | 5/2018 | Huang | H01R 12/613 |

FOREIGN PATENT DOCUMENTS

| | | |
|---|---|---|
| EP | 2590273 | 5/2013 |
| GB | 357 171 A | 9/1931 |
| JP | 2002-280690 | 9/2002 |
| WO | WO 2013/084437 | 6/2013 |

OTHER PUBLICATIONS

Official Action for European Patent Application No. 14290041.4, dated Oct. 18, 2017, 6 pages.

Official Action for China Patent Application No. 201580009202.5, dated Mar. 20, 2018, 9 pages.

* cited by examiner

PCB-BASED CONNECTOR DEVICE

CROSS REFERENCE TO RELATED APPLICATIONS

This application is a national stage application under 35 U.S.C. 371 and claims the benefit of PCT Application No. PCT/EP2015/053446 having an international filing date of 18 Feb. 2015, which designated the United States, which PCT application claimed the benefit of European Patent Application No. 14290041.4 filed 19 Feb. 2014, the disclosure of each of which are incorporated herein by reference.

FIELD OF THE INVENTION

An embodiment of the invention relates to a connector device for connection with a counter piece for establishing a mechanical and electric connection.

Moreover, an embodiment of the invention relates to a connection arrangement.

Beyond this, an embodiment of the invention relates to a method of manufacturing a connector device.

TECHNOLOGICAL BACKGROUND

Standard connectors generally constitute of metal inserts (i.e. contacts) surrounded by a polymer. Such an assembly is often created during a moulding process (such as injection moulding, transfer moulding, etc.). This method allows the creation of complex mechanical shapes, with a variety of physical properties depending on the selected material combination.

U.S. Pat. Nos. 5,374,196 and 5,515,604 disclose laminated connectors which comprise a plurality of layers of rigid dielectric material which are laminated together. The dielectric contains traces which are joined to contact pads, connecting the traces to adjacent circuit boards. Alternatively, the rigid dielectric layers contain recesses where the contact pads are placed. Cross-traces can be placed on each individual layer of dielectric or vias made through the dielectric layers, to interconnect traces.

However, there is still a need for a connector device which can be manufactured in a simple way and connected in a reliable way while offering the flexibility to implement a wide range of electric functions within the connector device.

SUMMARY OF THE INVENTION

There may be a need to provide a simply manufacturable and reliably connectable connector device offering a high flexibility in terms of implementable functions.

According to exemplary embodiments of the invention, a connector device for connection with a counter piece for establishing a mechanical and electric connection, a connection arrangement, and a method of manufacturing a connector device according to the independent claims are provided.

According to an exemplary embodiment of the invention, a connector device for connection with a counter piece for establishing a mechanical and electric connection is provided, wherein the connector device comprises at least two printed circuit board (PCB) elements or sections each comprising an electrically insulating core and at least one comprising an electrically conductive structure at least partially on the respective electrically insulating core, wherein the at least one electrically conductive structure is arranged at least partially on an exposed surface of the connector device and is configured for establishing the electric connection with the counter piece upon establishing the mechanical connection with the counter piece.

According to another exemplary embodiment of the invention, a connection arrangement is provided, wherein the connection arrangement comprises a connector device having the above mentioned features for connection with a counter piece, and the counter piece being configured for being mechanically and electrically connected with the connector device upon plugging the counter piece and the connector device together.

According to still another exemplary embodiment of the invention, a method of manufacturing a connector device for connection with a counter piece for establishing a mechanical and electric connection is provided, wherein the method comprises forming at least one printed circuit board (PCB) element as a subsection of a printed circuit board (PCB) and comprising an electrically insulating core and an electrically conductive structure at least partially on the electrically insulating core, arranging at least part of the electrically conductive structure on an exposed surface (of the connector device to be manufactured), and configuring the electrically conductive structure for establishing the electric connection with the counter piece upon establishing the mechanical connection between the connector device and the counter piece.

In the context of the present application, a "printed circuit board" (PCB) may denote a board of an electrically insulting core covered with electrically conductive material and conventionally serving for mounting thereon electronic members (such as packaged electronic chips, sockets, etc.) to be electrically coupled by the electrically conductive material. More specifically, a PCB may mechanically support and electrically connect electronic components using conductive tracks, pads and other features etched from copper sheets laminated onto an electrically non-conductive substrate. PCBs can be single sided (one copper layer), double sided (two copper layers) or of multi-layer type. Conductors on different layers may be connected with plated-through holes called vies. Advanced PCBs may contain components, such as capacitors, resistors or active devices, embedded in the substrate. The term "printed circuit board" may in particular encompass rigid PCBs, flexible PCBs, semiflexible PCBs and/or rigid-flex PCBs.

In the context of the present application, a "printed circuit board element" may particularly denote a subsection of a PCB, for instance obtained by a singulation of a PCB into multiple printed circuit board elements.

According to an exemplary embodiment, one or more PCB elements, in particular subsections of a printed circuit board (PCB), are used as main components (or only components) of a connector device. Upon connecting the connector device with a counter piece mechanically by a mutual engagement, an electric connection may be automatically established between electrically conductive structures of the connector device and electrically conductive structures of the counter piece without taking any further action. In other words, the electrically conductive structures of connector device and of the counter piece are automatically aligned in the correct manner by completing the mechanical connection. Forming connector devices based on PCB technology does not only allow to manufacture the connector device with a very simple manufacturing procedure, but also shows a high quality electric coupling safety.

In the following, further exemplary embodiments of the connector device, the connection arrangement, and the method will be explained.

In an embodiment, the printed circuit board element is embodied as a section of a printed circuit board. A printed circuit board may hence be separated, for instance by cutting or sawing, into a plurality of sections (for instance at least ten, in particular at least one hundred sections) each constituting a printed circuit board element. Each printed circuit board element may have a rectangular shape. This allows to use a standard material, i.e. PCB, as a basis for the formation of the connector device. Furthermore, standard procedures of PCB technology may be advantageously used.

In an embodiment, the length dimension and/or the width dimension of the printed circuit board element may be at least three times, in particular at least five times, of a thickness of the printed circuit board element. Thus, a flat and hence very compact connector device may be obtained. The thickness of a printed circuit board element may for instance be in a range between 30 μm and 3 mm, in particular in a range between 1 mm and 2 mm. The length and/or the width of a printed circuit board element may for instance be in a range between 3 mm and 10 cm, in particular in a range between 8 mm and 5 cm.

In an embodiment, the electrically insulating core comprises or consists of resin. This resin may for instance be an epoxy-based resin or low-CTE (coefficient of thermal expansion) resin, or high-Tg (glass transition temperature) resin.

In an embodiment, the electrically insulating core may be a planar sheet or plate. For instance, the electrically insulating core may have a thickness in a range between 30 μm and 10 cm. A planar shape of the electrically insulating core and of the printed circuit board element may simplify stacking of the printed circuit board element with at least one further printed circuit board element and/or a spacer structure (the latter may comprise one or more plug recesses, as described below).

In an embodiment, the respective electrically conductive structure comprises at least one patterned electrically conductive layer formed on one at least one of two opposing main surfaces of the electrically insulating core. Such an electrically conductive structure may be made of copper. The electrically conductive material may be deposited on the electrically insulating core, and may be subsequently patterned by a lithography and etching procedure.

In an embodiment, the electrically conductive structure comprises at least one via extending vertically through the electrically insulating core for electrically connecting the two opposing main surfaces of the electrically insulating core. Each via may be a through hole filled with electrically conductive material such as copper and may be electrically coupled with planar portions of the electrically conductive structure on at least one of the main surfaces of the electrically insulating core.

In an embodiment, the device comprises at least one embedded component (such as an electronic chip) embedded within the electrically insulating core and electrically coupled to the electrically conductive structure. In other words, at least one electric component may be integrated within the electrically insulating core of the printed circuit board element. This may allow to implement even complex electronic functionalities in a compact connector device. In other words, the connector device may either simply provide an electric connecting function electrically coupling the connector device to the counter piece, or may alternatively provide additional electronic functions.

Examples of the embedded components are a data storage memory such as a DRAM (or any other memory), a filter (which may for instance be configured as a high pass filter, a low pass filter or a bandpass filter, and which may for instance serve for frequency filtering), an integrated circuit (such as a logic IC), a signal processing component (such as a microprocessor), a power management component, an optical electrically interfacing member (for instance an optoelectronic member), a voltage converter (such as a DC/DC converter or an AC/DC converter), a cryptographic component, a capacitor, an inductance, a switch (for instance a transistor-based switch) and a combination of these and other functional electronic members.

In an embodiment, at least two printed circuit board elements are vertically stacked so that main surfaces of the at least two printed circuit board elements are arranged in parallel to one another. Thus, the connector architecture according to an exemplary embodiment is compatible with a three-dimensional integration, thereby allowing to implement a large number of electronic functions in a small volume.

In an embodiment, the device further comprises at least one plug recess (which may be a blind hole or a through hole in the device and may be externally accessible) for establishing the mechanical connection with the counter piece. In the context of the present application, a "plug recess" may particularly denote a blind hole or an indentation in the connector device which is externally accessible to serve as a female connector recess configured for receiving a male connector protrusion of the counter piece. For connecting such a connector device mechanically and electrically to the counter piece (such as another connector device) one or more plug recesses may be formed in the PCB element-based connector device mating with correspondingly/inverse shaped protrusions of the counter piece. Hence, the provision of one or more plug recesses renders the connection action performed by a user intuitive, simple, and failure-robust by allowing for a connection only upon connecting mating pairs of connector device and counter piece in terms of size, type and orientation.

In an embodiment, at least one plug recess is formed exclusively within one of the at least one printed circuit board element. Thus, a single printed circuit board element may be converted into a connector device merely by forming a recess within a single circuit board element to provide for a form closure connection with a counter piece. This results in an extremely compact and simple geometry.

In an embodiment, at least one plug recess is formed at an interface between two adjacent printed circuit board elements. Such a connector device may be formed by removing material from a first printed circuit board element and by attaching the so processed first printed circuit element to a second printed circuit board element. Consequently, the plug recess is formed directly at an interface between the two printed circuit board elements and is circumferentially delimited by both of them.

In another embodiment, the device comprises at least two printed circuit board elements and a spacer structure (spacing the printed circuit board elements) is arranged between the at least two printed circuit board elements, wherein at least one plug recess is formed in the spacer structure. In this embodiment, two conventional printed circuit board elements may be taken as such, and a spacer structure may be sandwiched between them for forming the connector device. When forming a recess in the spacer structure, the attachment of the spacer structure between the two printed circuit board elements forms the plug recess circumferentially delimited by one or both printed circuit board elements and the spacer structure. Alternatively, the recess may be formed in an interior of the spacer structure so that the spacer structure alone forms the plug recess.

For example, the spacer structure may be made of no-flow prepreg material so that fixing the spacer structure between the two printed circuit board elements by pressure and/or thermal energy will start polymerization of the prepreg material without loss of its shape, thereby maintaining a plug recess with a well-defined shape and position within the connector device but exposed to the environment. More generally, the spacer structure may be made of a material which is configured to remain dimensionally stable when fixing the spacer structure between the two printed circuit board elements, in particular by heating and/or applying pressure.

In an embodiment, the device comprises (additionally or alternatively to the provision of a plug recess) at least one plug protrusion contributing to establishing the mechanical connection with the counter piece. The plug protrusion can be considered as the inverse of a plug recess and can represent a male portion of the connector device cooperating with a correspondingly shaped plug recess of the counter piece.

In an embodiment, the device comprises at least two printed circuit board elements connected to one another directly, or indirectly via the spacer structure. By forming the connector device from a plurality of printed circuit board elements stacked vertically on top of one another, a three-dimensional integration to fulfil complex connection tasks and also advanced electronic functional tasks may be achieved.

In an embodiment, at least part of the electrically conductive structure is arranged on an exposed surface of the at least one printed circuit board element. Since printed circuit board elements may already comprise electrically conductive structures such as traces of copper, they can be used in the PCB-based connector device for providing the electronic connection tasks.

In an embodiment, at least part of the electrically conductive structure is arranged on at least one of two opposing main surfaces of the at least one printed circuit board element. In another embodiment, at least part of the electrically conductive structure is arranged on at least one of side walls perpendicular to two opposing main surfaces of the at least one printed circuit board element. In still another embodiment, at least part of the electrically conductive structure is arranged on an exposed surface of the plug recess, in particular parallel and/or perpendicular to two opposing main surfaces of the printed circuit board element(s). Therefore, the PCB based architecture of forming connector devices is compatible with very different orientations of the electrically conductive structure in a horizontal and/or vertical direction. The electrically conductive structure may be arranged at one, two, three, four or even more exposed surfaces of the device, depending on the electric contacting tasks required for a specific application.

In an embodiment, each of the at least two printed circuit board elements is formed as a subsection of a printed circuit board. In particular, a printed circuit board may be used as a semifinished product and may be singularized into a large number of printed circuit board elements, and the latter may in turn be used for manufacturing the connector device.

In an embodiment, the device is configured as one of the group consisting of a Lightning® connector (i.e. a connector having eight pins), a MIPI (Mobile Industry Processor Interface) connector, a USB (Universal Serial Bus) connector, a HDMI (High Definition Multimedia Interface), and a ZIF (Zero Insertion Force) connector. Connector devices according to these and many other connector standards can be formed on the basis of PCB elements.

In an embodiment, the counter piece is configured as a connector device having the above mentioned features. Hence, in such an embodiment, both connector pieces of the connection arrangement can be constructed based on PCB technology. This results in a very compact design and allows to be manufactured with low cost.

In an embodiment, the plug recess is formed by mechanically removing material of the at least one printed circuit board element and/or a spacer structure arranged between two printed circuit board elements, in particular by one of the group consisting of milling, laser processing, cutting, and punching. Such a mechanical procedure is simpler, faster and cheaper than for instance a chemical removal procedure (which may be implemented according to other embodiments as well). Furthermore, a mechanical removal of material involves less waste and pollution.

In an embodiment, the spacer structure having one or more plug recesses is connected between the two printed circuit board elements by adhering and/or pressing. For instance, an adhesive may be used which starts adhering upon application of thermal energy. Alternatively, an adhesive may be used which starts adhering upon applying pressure. The adhesive material may be separate from the printed circuit board element(s) and/or the spacer structure. Alternatively, the adhesive material may form part of the printed circuit board element(s) and/or the spacer structure. The latter alternative is particularly advantageous since it keeps the number of components used for the manufacturing procedure small and hence the manufacturing procedure simple.

In an embodiment, the method comprises providing at least one printed circuit board (in particular a full PCB), optionally patterning electrically conductive material on at least one main surface of the at least one printed circuit board, and singularising the at least one printed circuit board with its electrically conductive material (and optionally plug recesses) into a plurality of sections, each section constituting a connector device according to an exemplary embodiment. Therefore, at least a part of the manufacture of the connector device may be formed in a batch process, i.e. for a plurality of connector devices simultaneously, based on the processing of one or more boards which is/are then singularized, for instance by sawing, laser cutting, or etching. This allows to manufacture the connector devices in a fast time and with low cost.

In an embodiment, the method further comprises forming a plurality of plug recesses (in at least one printed circuit board and/or a spacer structure) before the singularising. Thus, also the formation of the plug recesses may be performed on board level, i.e. during a batch process.

In an embodiment, the method further comprises stacking at least two printed circuit boards before singularizing the stack into the plurality of sections (constituting connector devices). Therefore, the concept of forming connector devices on the basis of PCB technologies allows a three-dimensional integration.

In an embodiment, the method comprises arranging a spacer board (such as an electrically insulating sheet) between the at least two stacked printed circuit boards before singularizing the stack into the plurality of sections each of which comprising a portion of the spacer board constituting a spacer structure. Thus, also the provision of a spacer board having a plurality of plug recesses can be integrated in the batch process of manufacturing multiple connector devices simultaneously.

In one embodiment, the connector device may be a standalone device. Thus, the connector device may be a body which may be handled separately from other apparatuses and may be selectively plugged onto or into another apparatus. For example, such a connector device may be a portable memory stick.

In another embodiment, the connector device may form part of a large apparatus. For instance, it may be connected via a cable or directly to an apparatus such as a computer for connecting the apparatus to a partner device or counter piece.

The aspects defined above and further aspects of the invention are apparent from the examples of embodiment to be described hereinafter and are explained with reference to these examples of embodiment.

The invention will be described in more detail hereinafter with reference to examples of embodiment but to which the invention is not limited.

The illustrations in the drawings are schematical. In different drawings, similar or identical elements are provided with the same reference signs.

Figure 1:
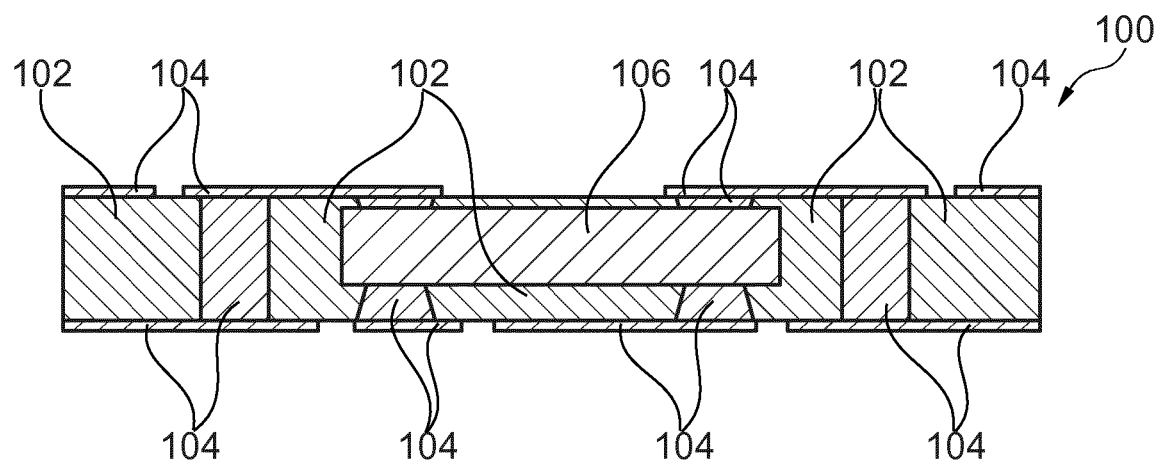
FIG. 1 and FIG. 2 illustrate cross sections of printed circuit board elements used as a basis for manufacturing a connector device according to an exemplary embodiment of the invention.

Before, referring to the drawings, exemplary embodiments will be described in further detail, some basic considerations will be summarized based on which exemplary embodiments of the invention have been developed.

An embodiment of the invention provides a PCB-based connector device. Exemplary embodiments may have a simple mechanical shape (such as rectangles/squares and combinations thereof) and interconnection patterns. Advantages of such a connector architecture are, inter alia, the following:
  No need for tooling, thus very-low set-up cost and time,
  Capability for large-scale manufacturing thanks to panel-level/board level or batch processing,
  Capability for very-complex routing thanks to the opportunity to implement a multi-layer architecture,
  Capability for very-fine contact surfaces thanks to the possibility of fine-line structuring,
  Capability for integrated functions thanks to an optional embedding of embedded components (such as discrete components or integrated layers).

In an embodiment of the manufacturing procedure, contacts may be created through standard structuring (such as tracks, edge-plating and/or plated through holes depending on the end-orientation). After that, panels may be stacked and bonded to achieve the desired architecture. Solder paste can then be placed in specific areas to improve soldering behaviour. To finish the product, the connector devices may be singulated from the panel.

One task which may be solved by exemplary embodiments of the invention is to create the conducting surface(s) in one or multiple directions, in order to meet integration demands. Three exemplary possible solutions are:
  Standard PCB tracks
  Vertical plating
  Plated through holes (optionally sawn)

By applying one or more of these three processes, contact surfaces and soldering surfaces can be created at desired angles (such as) 90°/180° of each other. One such combination, involves "Standard PCB Tracks" and "Sawn plated through holes".

Exemplary embodiments allow the creation of complex geometrical shapes, the separation of the connector device from the PCB for increased placement flexibility and the addition of functions through embedding. This may be achieved by increasing the mechanical complexity and the functionalities. Those functions can include:
  Signal processing,
  Power management,
  DRM,
  Opto-electrical interfacing.

Due to the flexibility of PCB manufacturing processes, shapes can be repeatedly stacked, thereby dramatically increasing the number of contact surfaces (for instance four contact surfaces, or even significantly more contact surfaces).

Figure 2:
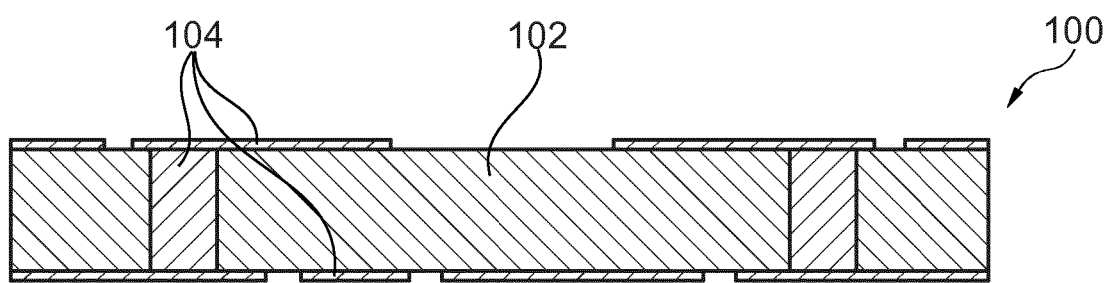
Figure 16:
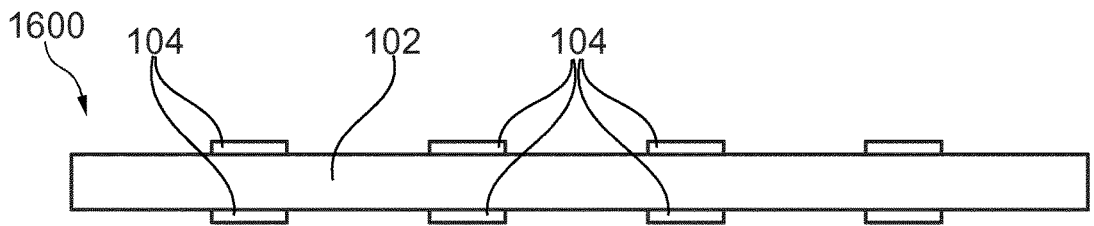
FIG. 16 to FIG. 18 show cross-sectional views of structures obtained during carrying out a method of manufacturing a plurality of connector devices in a batch procedure according to an exemplary embodiment of the invention.

FIG. 1 and FIG. 2 illustrate cross sections of printed circuit board elements 100 (which may be subsections of larger printed circuit boards/panels, compare for instance FIG. 16) used as a basis for manufacturing a connector device 600 (compare for instance FIG. 6) according to an exemplary embodiment of the invention.

The printed circuit board elements 100 of FIG. 1 comprise an electrically insulating core 102 which is made of a (for instance) reinforced epoxy-based resin (or prepreg) material and is shaped as a plate or sheet. Both opposing main surfaces of the electrically insulating core 102 are covered with planar sections of an electrically conductive structure 104 embodied as respectively patterned electrically conductive layers formed on each of two opposing main surfaces of the electrically insulating core 102 in a horizontal direction according to FIG. 1. The electrically conductive structure 104 furthermore comprises vias extending, according to FIG. 1 vertically, through the electrically insulating core 102 for electrically connecting the two opposing main surfaces of the electrically insulating core 102. Therefore, the portions of the electrically conductive structure 104 on the two opposing main surfaces of the electrically insulating core 102 are electrically coupled by a short path by via the vias. In view of the foregoing, the electrically conductive structure 104 is partially arranged on an exposed surface of the printed circuit board element 100, and is partly arranged in an interior of the printed circuit board element 100. Thus, the available volume can be very efficiently used to provide a complex circuitry.

An embedded component 106 is integrated or embedded within the electrically insulating core 102 and is electrically coupled to the planar portions of the electrically conductive structure 104 on the two opposing main surfaces of the electrically insulating core 102 by means of part of the vias.

The embedded component 106 may be any desired type of active electric component or passive electric component. In the shown embodiment, the embedded component 106 may be embodied as a semiconductor memory such as a DRAM in order to extend the electric connection functionality of the connector device 600 to be manufactured by providing a data storage function. Hence, an intelligent connector device 600 with extended electronic functionality may be formed when implementing the embedded component 106 into the printed circuit board element 100.

Although not shown in FIG. 1, it is also possible in this and other embodiments described herein that, additionally or alternatively, one or more lateral side surfaces (i.e. vertical surface portions according to FIG. 1) of the printed circuit board element 100 is/are covered with electrically conductive material such as copper to form the electrically conductive structure 104.

The printed circuit board element 100 shown in FIG. 2, which may form the basis of connector devices 600 manufactured according to other exemplary embodiments differs from the printed circuit board element 100 shown in FIG. 1 in that the embedded component 106 and vias connecting the embedded component 106 and forming part of the electrically conductive structure 104 are omitted. Thus, the functionality of a connector device 600 according to an embodiment using only printed circuit board elements 100 of FIG. 2 as a basis may exclusively provide a desired electric coupling scheme between individual ones of pads of the electrically conductive structure 104 and other pads of the corresponding counter piece physically contacting the pads of the electrically conductive structure 104.

Figure 3:
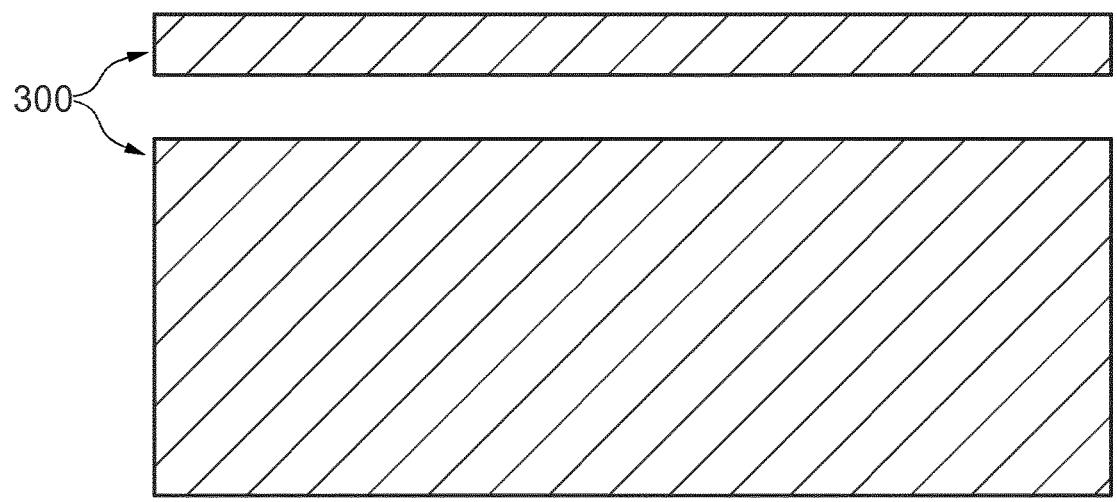
FIG. 3 illustrates a side view and a plan view of a spacer structure used as a basis for manufacturing a connector device according to an exemplary embodiment of the invention in connection with the printed circuit board elements of FIG. 1 and/or FIG. 2.

FIG. 3 illustrates a side view and a plan view of a sheet-like spacer structure 300 used as a basis for manufacturing connector devices 600 according to exemplary embodiments of the invention in connection with the printed circuit board elements 100 of FIG. 1 and/or FIG. 2.

The spacer structure 300 can also be formed of a glass fiber reinforced epoxy-based resin (or prepreg) material and is shaped as a plate or sheet. It is preferable that the spacer structure 300 is made of a material which does not change its shape (for instance does not start to flow) upon applying thermal energy and/or pressure for adhering the spacer structure 300 between two printed circuit board elements 100, as shown in FIG. 1 or FIG. 2, because this ensures the maintenance of the correct orientation of the material of the spacer structure 300 (and therefore the task of spacing two printed circuit board elements 100) when forming a connector device 600. For example, this may be guaranteed by embodying the spacer structure 300 from a no flow prepreg material.

Figure 4:
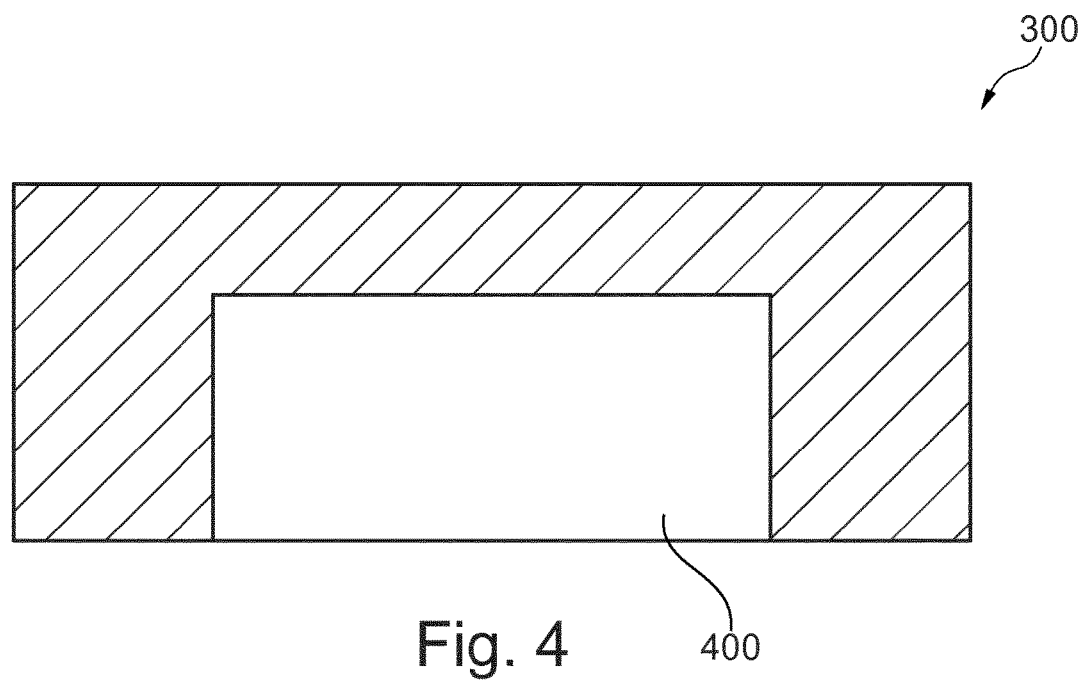
FIG. 4 illustrates a plan view of the spacer structure of FIG. 3 after having formed a plug recess in the spacer structure by a purely mechanical material removal procedure.

FIG. 4 illustrates a plan view of the spacer structure 300 of FIG. 3 after having formed a plug recess 400 in the spacer structure 300 by a purely mechanical material removal procedure.

Although a chemical material removal procedure (such as etching) is generally possible as well, it is nevertheless preferred to apply a mechanical removal procedure (such as milling, cutting or punching) or laser removal process because this allows the formation of a precisely shaped and dimensioned plug recess 400 in a very simple way. As can be taken from FIG. 4, the spacer structure 300 remains a continuous body after formation of the plug recess 400 which therefore does not separate the spacer structure 300 into isolated islands. This allows to simplify the handling of the recessed spacer structure 300 for manufacturing a connector device 600, because, when taking this measure, only one piece has to be handled and sandwiched between two printed circuit board elements 100. After formation of the plug recess 400, the spacer structure 300 shown in FIG. 4 is basically U-shaped, and the plug recess 400 has a rectangular cross-section.

Figure 5:
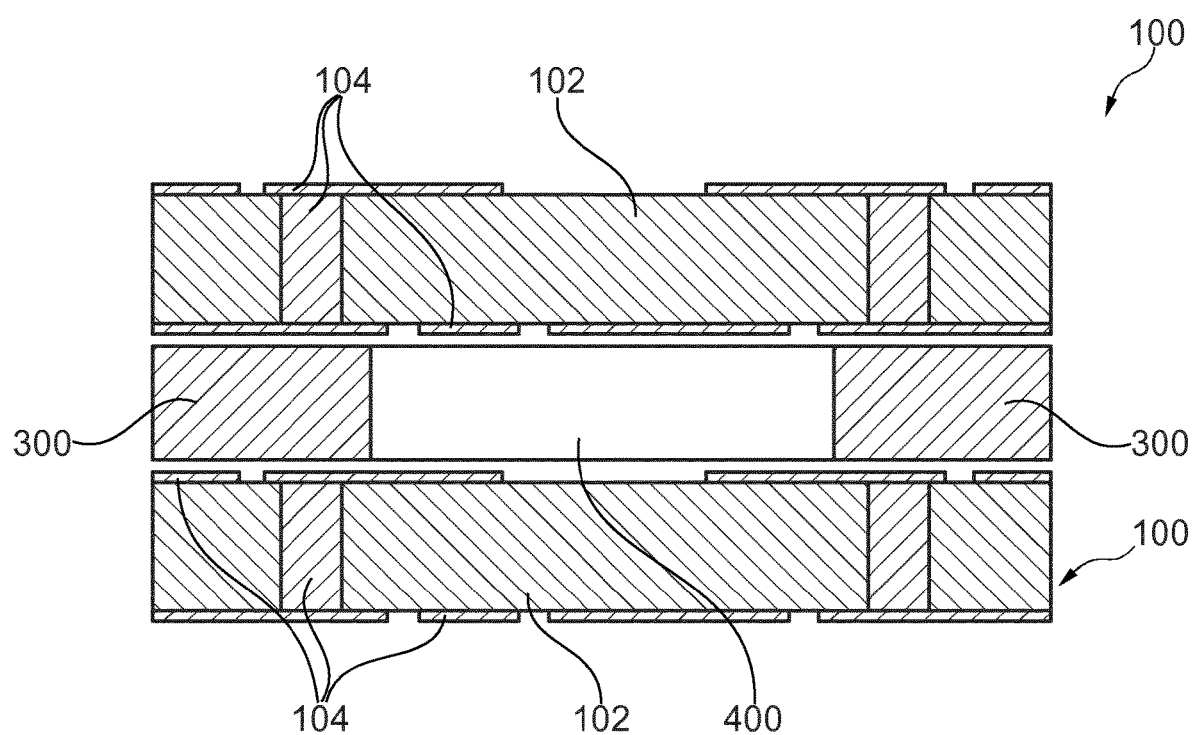
FIG. 5 illustrates a structure obtained during carrying out a procedure of assembling two printed circuit board elements as shown in FIG. 2 with a plug recess comprising spacer structure as shown in FIG. 4 for manufacturing a connector device according to an exemplary embodiment of the invention.

FIG. 5 illustrates a structure obtained during carrying out a procedure of assembling two printed circuit board elements 100 as shown in FIG. 2 with a plug recess 400 comprising spacer structure 300 as shown in FIG. 4 for manufacturing a connector device 600 according to an exemplary embodiment of the invention. As shown in FIG. 5, one printed circuit board element 100, one spacer structure 300 and another printed circuit board element 100 are aligned on top of each other to form a vertical stack of planar bodies. The side edges of the stacked bodies coincide or match to one another and are in alignment (with the exception of the plug recess 400). Thus, a compact connector device 600 may be obtained.

After having aligned the printed circuit board elements 100 and the spacer structure 300 as shown in FIG. 5, they are connected to one another by the application of pressure and/or thermal energy (i.e. by an increase of the temperature). For instance, prepreg material of the spacer structure 300 and/or the electrically insulating core 102 of the printed circuit board elements 100 may become soft or may start melting at a certain temperature of for instance 90° C., so that polymerization starts and curing or hardening of the material begins. Therefore, the printed circuit board elements 100 with the sandwiched spacer structure 360 are laminated together, wherein this procedure maintains the physical dimensions of the spacer structure 300 including its plug recess 400 unchanged. Hence, a robust connector device 600 with precisely definable dimensions is obtained. This is of upmost advantage, because the connector device 600 and its counter piece can only be brought in mechanical and electrical connection by plugging them together when the mechanical connection elements (i.e. the plug recess 400 of the connector device 600 and an inversely shaped protrusion of the counter piece, not shown) are configured to match with form closure and when the electrical connection elements (i.e. the pads constituted by the exposed sections of the electrically conductive structure 104 and corresponding pads of the counter piece, not shown) remain located at accurately definable positions.

Figure 6:
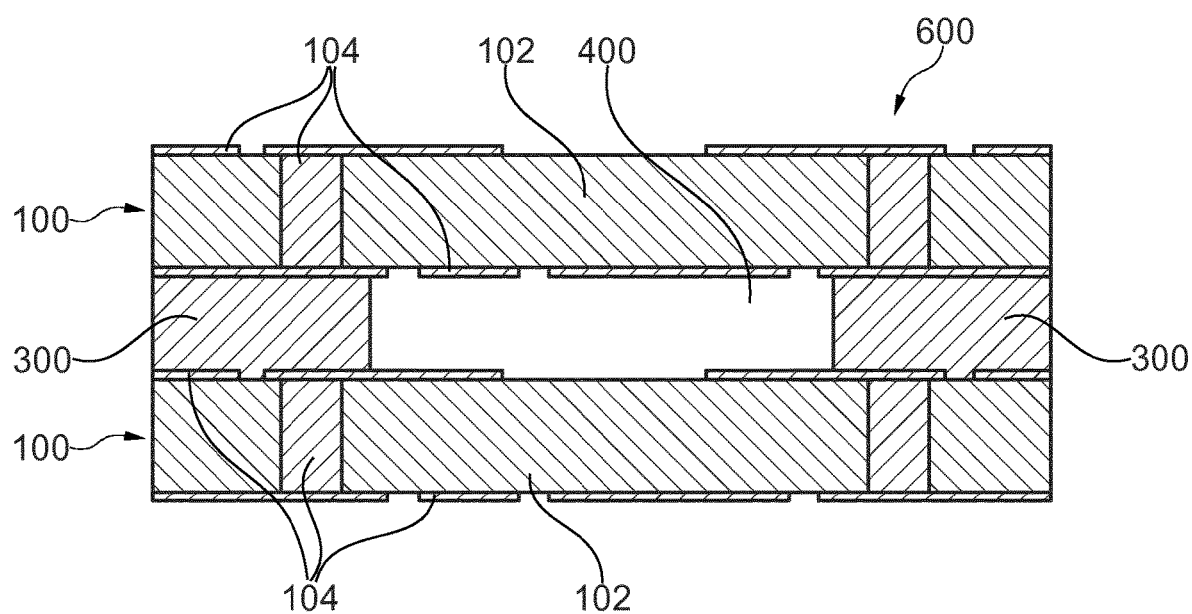
FIG. 6 shows a cross-sectional view of a connector device according to an exemplary embodiment of the invention manufactured according to the procedure of FIG. 2 to FIG. 5.

FIG. 6 shows a cross-sectional view of the connector device 600 in a PCB-only-combination (i.e. without embedded component 106) according to an exemplary embodiment of the invention manufactured according to the procedure of FIG. 2 to FIG. 5.

The PCB-based connector device 600 is configured for being electrically coupled with a counter piece (not shown in FIG. 6) for establishing a defined mechanical and electric connection. The connector device 600 comprises the two printed circuit board elements 100 with their insulating cores 102 and electrically conductive structures 104 partially on and partially in the electrically insulating core 102. Vertically stacked between the two printed circuit board elements 100 is the spacer structure 300 with its plug recess 400 for establishing the mechanical connection with the counter piece 1500. As can be taken from FIG. 6, various sections or pads of the electrically conductive structures 104 are arranged on exposed surfaces of the connector device 600 and are configured for establishing the electric connection with the counter piece upon establishing the mechanical connection with the counter piece.

Various exposed sections of the electrically conductive structure 104 are arranged on an exposed surface of the plug recess 400, according to FIG. 6 all parallel to the two opposing main surfaces of the printed circuit board elements 100 and the spacer structure 300. With a corresponding dimensioning, adaptation of the shape of the plug recess 400 and the arrangement of the pads realized by the electrically conductive structures 104, the device 600 may be configured as a specific type of connector (for instance a MIPI connector).

Figure 7:
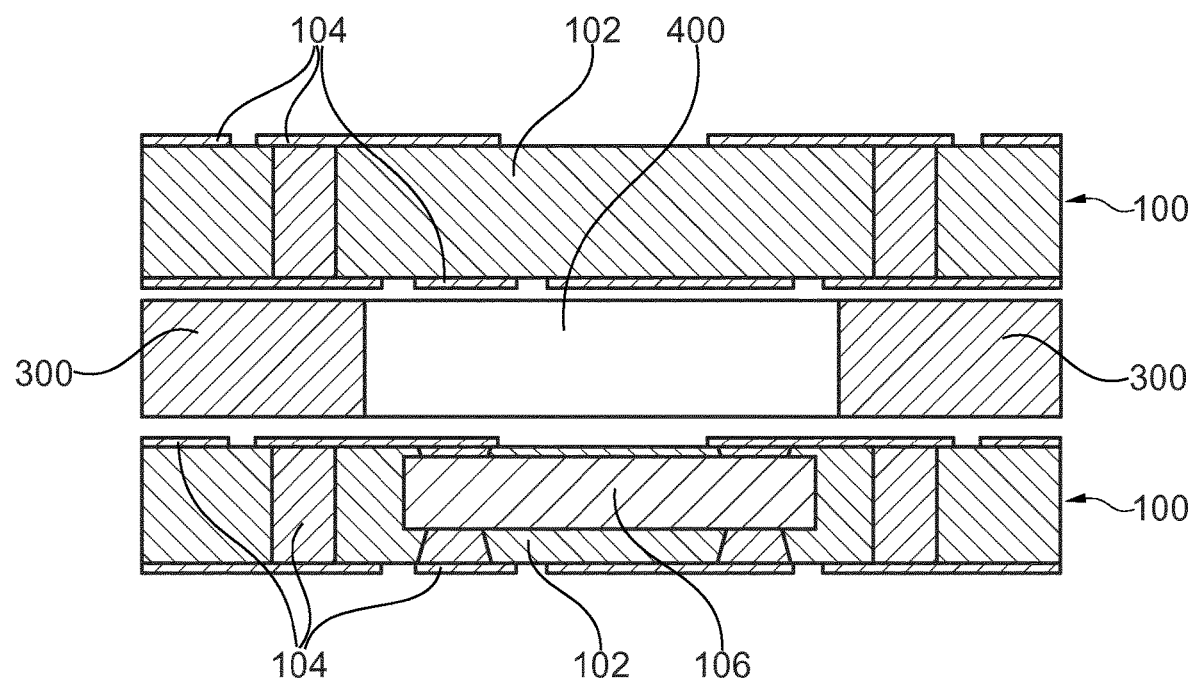
FIG. 7 illustrates a structure obtained during carrying out a procedure of assembling two printed circuit board elements as shown in FIG. 1 and FIG. 2 with a plug recess comprising spacer structure as shown in FIG. 4 for manufacturing a connector device according to another exemplary embodiment of the invention.

FIG. 7 illustrates a structure obtained during carrying out a procedure of assembling two printed circuit board elements 100 as shown in FIG. 1 and FIG. 2 with a plug recess 400 comprising spacer structure 300 as shown in FIG. 4 for manufacturing a connector device 600 according to another exemplary embodiment of the invention.

The arrangement shown in FIG. 7 differs from the arrangement shown in FIG. 5 in that the lower printed circuit board element 100 now comprises an embedded component 106, i.e. is configured as a printed circuit board element 100 shown in FIG. 1. By applying a connection procedure as described above referring to FIG. 6, the arrangement shown in FIG. 7 can be transformed into the connector device 600 shown in FIG. 8.

Figure 8:
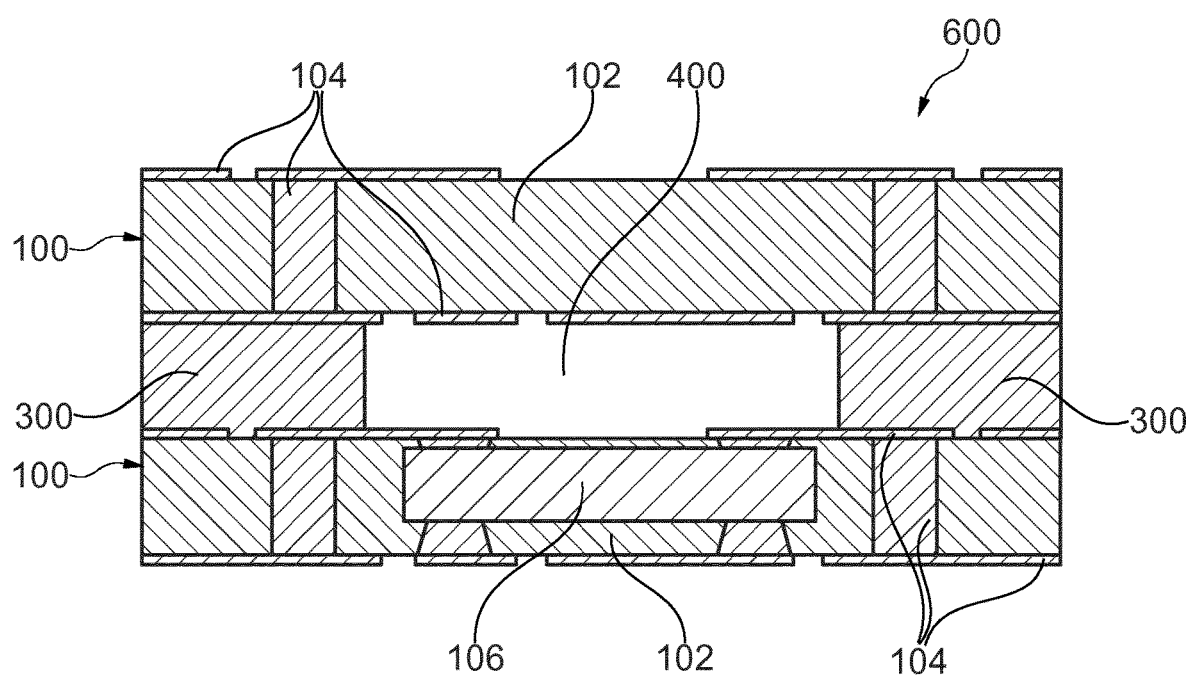
FIG. 8 shows a cross-sectional view of a connector device according to an exemplary embodiment of the invention manufactured according to the procedure of FIG. 1 to FIG. 4 and FIG. 7.

FIG. 8 shows a cross-sectional view of the PCB-embedded-combination connector device 600 according to an exemplary embodiment of the invention manufactured according to the procedure of FIG. 1 to FIG. 4 and FIG. 7.

When the embedded component 106 is configured as a semiconductor memory such as a DRAM, the connector device 600 of FIG. 8 can serve as a portable memory-connector-arrangement, such as a PCB-based USB stick. For example, with a corresponding dimensioning, adaptation of the shape of the plug recess 400 and the arrangement of the pads realized by the electrically conductive structures 104, the smart connector device 600 may be configured as a connector of a specific type (for instance a USB connector) with data storage function.

Figure 9:
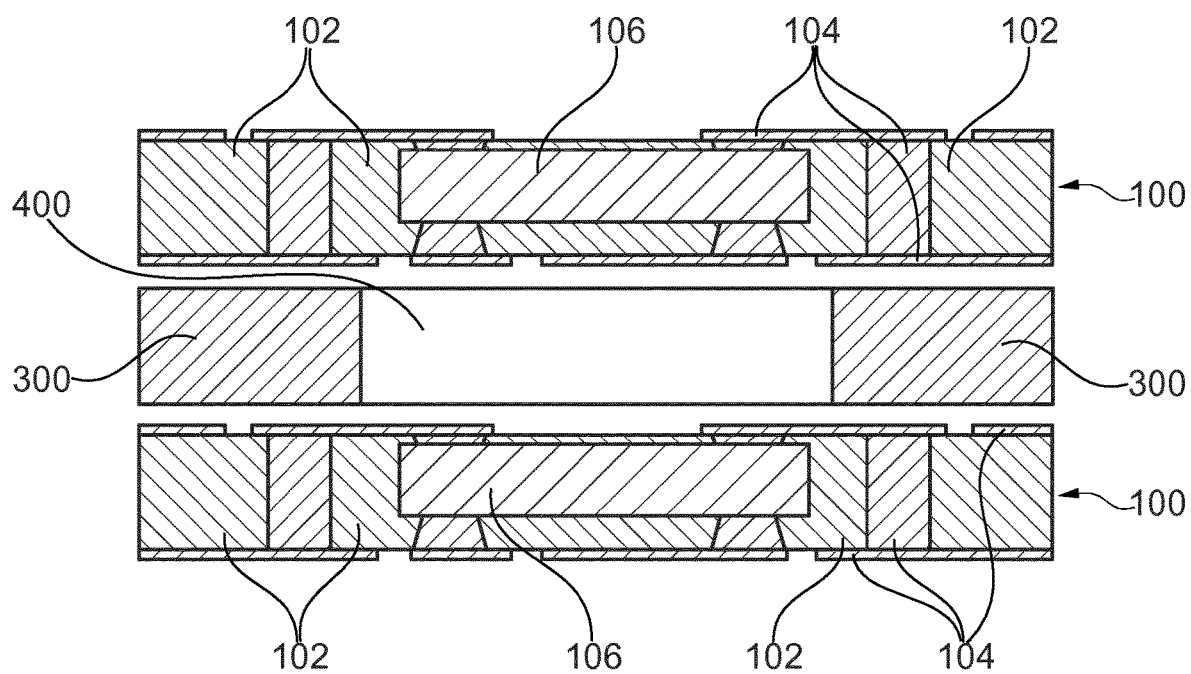
FIG. 9 illustrates a structure obtained during carrying out a procedure of assembling two printed circuit board elements as shown in FIG. 1 with a plug recess comprising spacer structure as shown in FIG. 4 for manufacturing a connector device according to still another exemplary embodiment of the invention.

FIG. 9 illustrates a structure obtained during carrying out a procedure of assembling two printed circuit board elements 100 as shown in FIG. 1 with a plug recess 400 comprising spacer structure 300 as shown in FIG. 4 for manufacturing a connector device 600 according to still another exemplary embodiment of the invention.

The arrangement shown in FIG. 9 differs from the arrangement shown in FIG. 7 in that now also the upper printed circuit board element 100 comprises an embedded component 106, i.e. is configured as a printed circuit board element 100 shown in FIG. 1. By applying a connection procedure as described above referring to FIG. 6, the arrangement shown in FIG. 9 can be transformed into the connector device 600 shown in FIG. 10.

Figure 10:
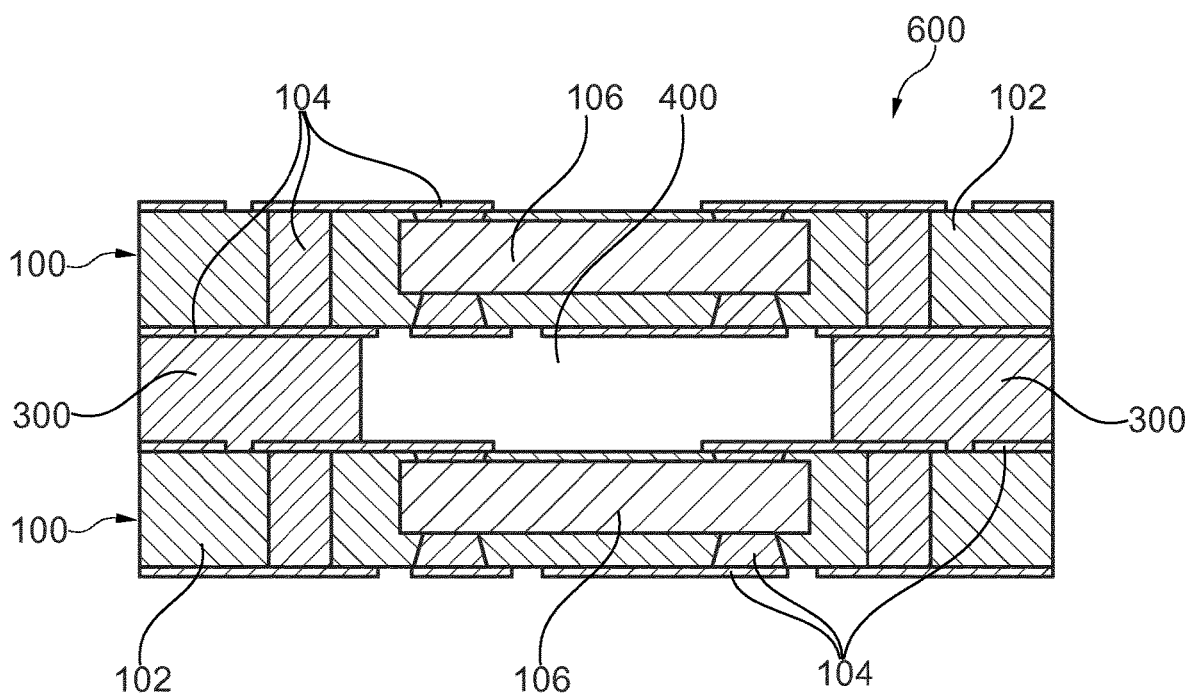
FIG. 10 shows a cross-sectional view of a connector device according to an exemplary embodiment of the invention manufactured according to the procedure of FIG. 1, FIG. 3 to FIG. 4 and FIG. 9.

FIG. 10 shows a cross-sectional view of a connector device 600 according to an exemplary embodiment of the invention manufactured according to the procedure of FIG. 1, FIG. 3 to FIG. 4 and FIG. 9. The function of the connector device 600 shown in FIG. 10 depends on the configuration of the embedded components 106. For instance, one of the embedded components 106 may provide an encryption function, the other one a voltage converter function, etc. Thus, basically any desired electrical function and functional combination may be integrated in the compact connector device 600.

Figure 11:
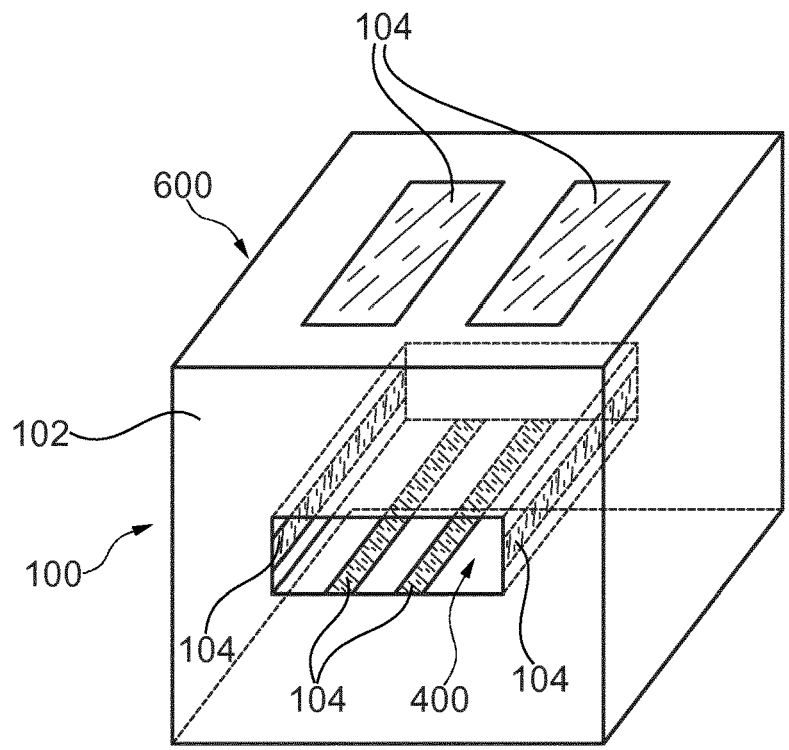
FIG. 11 and FIG. 12 show three-dimensional views of connector devices according to exemplary embodiments of the invention.
Figure 12:
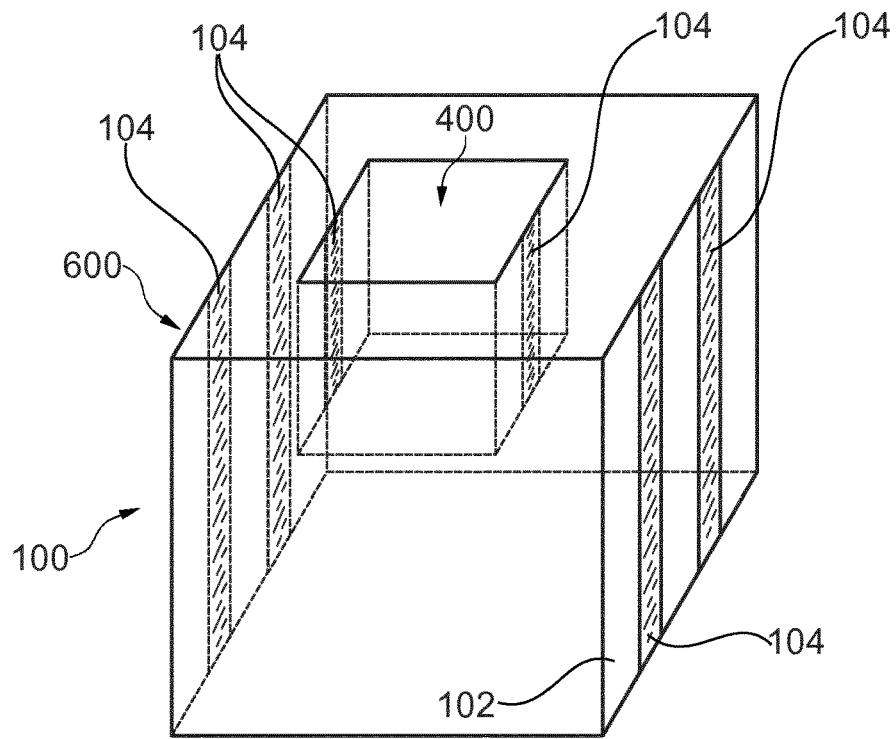

FIG. 11 and FIG. 12 show three-dimensional views of connector devices 600 according to exemplary embodiments of the invention.

According to the connector device 600 shown in FIG. 11 (which may be formed based on one or more printed circuit board elements 100), part of the electrically conductive structure 104 is arranged on vertical side walls within the plug recess 400 perpendicular to two horizontal opposing main surfaces of the printed circuit board element 100, and another part of the electrically conductive structure 104 is arranged horizontally on and parallel to horizontal opposing main surfaces of the printed circuit board element 100.

According to the connector device 600 shown in FIG. 12, all sections of the electrically conductive structure 104 are arranged on vertical side walls within the plug recess 400 and outside of the plug recess 400 perpendicular to two horizontal opposing main surfaces of the printed circuit board element(s) 100.

Figure 13:
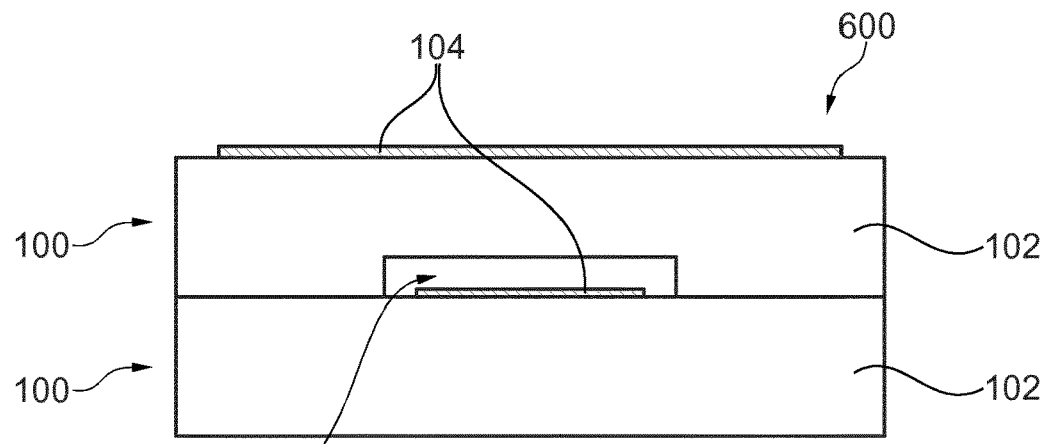
FIG. 13 shows a cross-sectional view of a connector device according to an exemplary embodiment of the invention manufactured by directly connecting two printed circuit board elements to one another, one of which comprising a plug recess.

FIG. 13 shows a cross-sectional view of a connector device 600 according to an exemplary embodiment of the invention manufactured by connecting two printed circuit board elements 100 to one another, one of which comprising a plug recess 400.

According to the connector device 600 shown in FIG. 13, the plug recess 400 is formed at an interface between two adjacent printed circuit board elements 100. The device 600 hence comprises two printed circuit board elements 100 connected to one another directly. In this embodiment, the plug recess 400 is formed by removing material from one of the printed circuit board elements 100 rather than providing a separate spacer structure 300. Hence, a spacer structure 300 is omitted according to FIG. 13, and the entire connection device 600 is formed exclusively from two printed circuit board elements 100.

Figure 14:
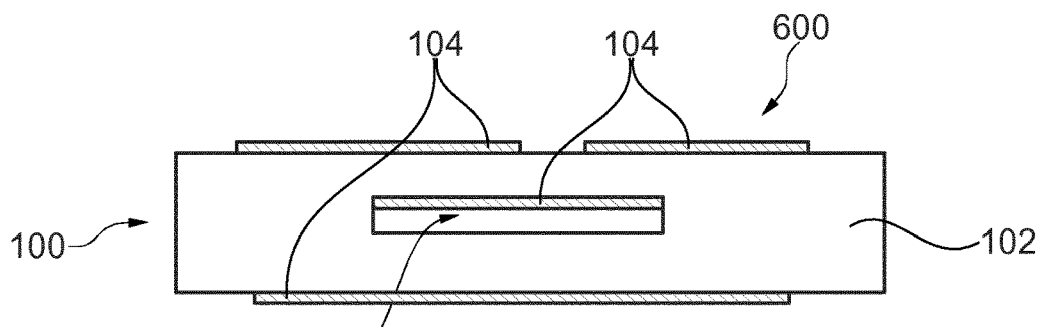
FIG. 14 shows a cross-sectional view of a connector device according to an exemplary embodiment of the invention manufactured on the basis of a single printed circuit board element comprising a plug recess in its interior.

FIG. 14 shows a cross-sectional view of a connector device 600 according to an exemplary embodiment of the invention manufactured on the basis of a single printed circuit board element 100 comprising a plug recess 400 in its interior.

According to FIG. 14, the plug recess 400 is formed exclusively within exactly one printed circuit board element 100. In other words, the plug recess 400 is formed by removing material from the single printed circuit board element 100. Hence, a spacer structure 300 as well as further printed circuit board elements 100 are omitted according to FIG. 13, and the entire connection device 600 is formed exclusively from one printed circuit board element 100.

Figure 15:
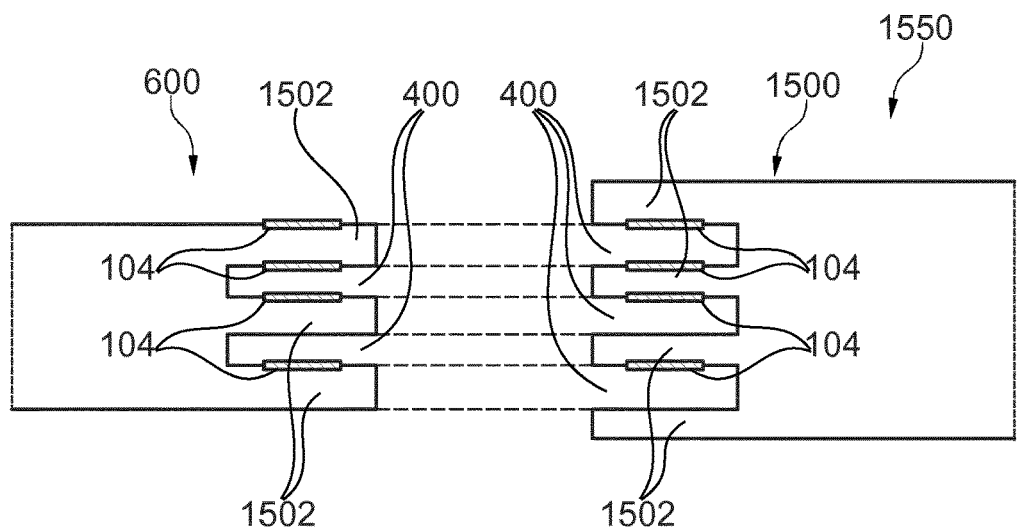
FIG. 15 shows a connection arrangement formed by two correspondingly configured connector devices to be connected electrically and mechanically according to an exemplary embodiment of the invention.

FIG. 15 shows a connection arrangement 1550 formed by two correspondingly configured connector devices 600 to be connected electrically and mechanically according to an exemplary embodiment of the invention.

The connection arrangement 1550 comprises a connector device 600 of the type described above for connection with the counter piece 1500. The counter piece 1500 is configured for being mechanically and electrically connected with the connector device 600 upon plugging the counter piece 1500 in the plug recess 400. The counter piece 1500 is also configured as a PCB-based connector device of the type described above (but may, in other embodiments, be manufactured in other way, for instance according to another connector technology or as a corresponding part, such as a plug or a socket, of an electronic apparatus, such as a computer).

Along a vertical direction of FIG. 15, both the connector device 600 and the counter piece 1500 comprise alternating sequences of plug recesses 400 and plug protrusions 1502. These sequences are adapted to match and align to one another so that the connector device 600 and the counter piece 1500 may be plugged together by approaching them along a horizontal direction of FIG. 15 for an engagement thereof. By this engagement, both a mechanical and electrical connection is established, since the respective sections of the electrically conductive structures 104 are then brought in direct physical contact with one another.

Figure 17:
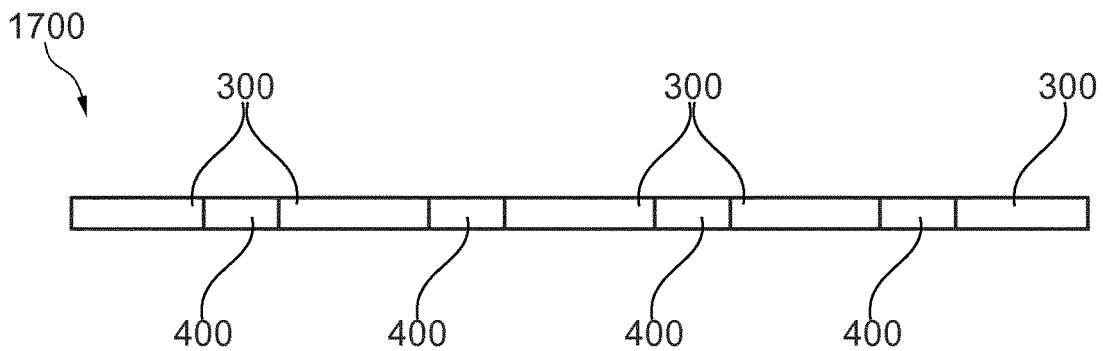
Figure 18:
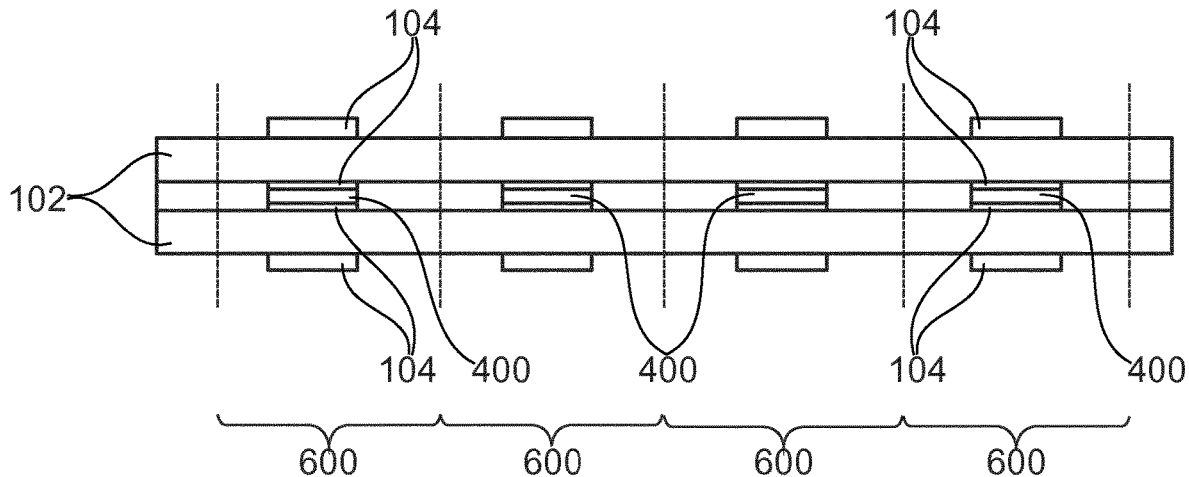

FIG. 16, FIG. 17 and FIG. 18 show cross-sectional views of structures obtained during carrying out a method of manufacturing a plurality of connector devices 600 in a batch procedure based on panels which are fixed to one another and then separated into sections according to an exemplary embodiment of the invention.

In the framework of this manufacturing method, two printed circuit boards 1600 (such as PCB panels) are provided, one of which being shown in FIG. 16. A plurality of connector devices 600 are then manufactured in a simultaneous rather than sequential procedure based on these printed circuit boards 1600. Electrically conductive layers deposited on both opposing main surfaces of the printed circuit boards 1600 may be patterned, if desired or required, so as to form individual electrically conductive islands or sections constituting electrically conductive structures 104 of the connector devices 600 to be manufactured.

As can be taken from FIG. 17, a plurality of plug recesses 400 are formed in a spacer board 1700 or panel. The spacer board 1700 can be a sheet of electrically insulating material, for instance prepreg, which can be punched or laser processed or milled, etc. in a batch procedure to form the plug recesses 400.

As can be taken from FIG. 18, the spacer board 1700 is arranged between the two printed circuit boards 1600 for forming a board stack. These three boards of the board stack are then fixed to one another, for example by adhering them together.

As indicated schematically by vertical dotted lines in FIG. 18, it is then possible to singularize the integral board stack into a plurality of sections, each section constituting a connector device 600.

By manufacturing the connector devices 600 according to a batch procedure as illustrated in FIG. 16 to FIG. 18, rapid and cheap mass manufacture of connector devices 600 is possible on an industrial scale. If desired, embedded components 106 may be foreseen in one or both of the electrically insulating cores 102 of the printed circuit boards 1600 shown in FIG. 16 to extend the electronic functionality of the manufactured connector devices 600.

Referring to the embodiments described above, it should of course be mentioned that any desired number of plug recesses 400 (i.e. no, one, two or more plug recesses 400) and/or any desired number of embedded components 106 (i.e. no, one, two or more embedded components 106) may be implemented. Also, the number of used printed circuit board elements 100 is variable, i.e. may be one, two or more. Beyond this, the number of used spacer structure 300 is variable, i.e. may be zero, one, two or more. In particular, any particular stacking of the mentioned or other components is possible. In other words, the PCB-based connector device architecture according to exemplary embodiments is highly appropriate for a three-dimensional integration. The connector devices 600 may be embodied as male connector pieces, or female connector pieces.

It should be noted that the term "comprising" does not exclude other elements or steps and the "a" or "an" does not exclude a plurality. Also elements described in association with different embodiments may be combined.

It should also be noted that reference signs in the claims shall not be construed as limiting the scope of the claims.

Implementation of the invention is not limited to the preferred embodiments shown in the figures and described above. Instead, a multiplicity of variants are possible which use the solutions shown and the principle according to the invention even in the case of fundamentally different embodiments.

The invention claimed is:

1. A connector device for connection with a counter piece for establishing a mechanical and electric connection, the connector device comprising:
 a first printed circuit board comprising a first electrically insulating core and at least one electrically conductive structure at least partially on a surface of the first electrically insulating core, wherein the at least one electrically conductive structure is configured for establishing the electric connection with the counter piece upon establishing the mechanical connection with the counter piece; and
 a second printed circuit board including a second electrically insulating core including a plug recess for establishing the mechanical connection with the counter piece, wherein the plug recess is disposed in a main surface of the second electrically insulating core so that the second electrically insulating core has a first thickness in a region of the plug recess and a second thickness greater than the first thickness in a region surrounding the plug recess, wherein the region of the plug recess includes a first sidewall of the second electrically insulating core, a second sidewall of the second electrically insulating core, and a surface of the second electrically insulating core set back from the main surface and that connects the first sidewall and the second sidewall, wherein the first electrically insulating core and the second electrically insulating core are directly connected to one another to form the plug recess directly at an interface between the first electrically insulating core and the second electrically insulating core and so that the plug recess is circumferentially delimited by the surface of the first electrically insulating core, the first and second sidewalls of the second electrically insulating core, and the surface of the second electrically insulating core that connects the first sidewall and the second sidewall, wherein the first electrically insulating core is unitary, and wherein the second electrically insulating core is unitary.

2. The device of claim 1, further comprising at least one of the following features:

at least one embedded component embedded within the first electrically insulating core and electrically coupled to the at least one electrically conductive structure;

at least one of the first and second electrically insulating cores comprises resin;

at least one of the first and second electrically insulating cores is configured as a plate;

the at least one electrically conductive structure comprises at least one patterned electrically conductive layer formed on the surface of the first electrically insulating core;

the at least one electrically conductive structure comprises at least one via extending through the first electrically insulating core;

the first and second printed circuit boards are vertically stacked so that main surfaces of the first and second printed circuit boards face one another;

the device comprises at least one plug protrusion contributing to establishing the mechanical connection with the counter piece;

at least part of the at least one electrically conductive structure is arranged on at least one of the first or second side walls of at the second electrically insulating core in the region of the plug recess;

the device is configured as one of the group consisting of a Lightning connector, a MIPI connector, a USB connector, a HDMI connector, and a ZIF connector.

3. The device of claim 1, further comprising a plurality of embedded components, each embedded component being embedded within at least one of the first electrically insulating core and the second electrically insulating core and electrically coupled to a respective electrically conductive structure.

4. The device of claim 3, wherein the at least one embedded component comprises at least one of the group consisting of an active electric component, and a passive electric component.

5. The device of claim 1, wherein at least part of the at least one electrically conductive structure is arranged on an exposed surface of the at least one plug recess.

6. A connection arrangement, the connection arrangement comprising:

the connector device of claim 1 for connection with the counter piece, wherein the counter piece is configured for being mechanically and electrically connected with the connector device upon plugging the counter piece and the connector device together.

7. The connector device according to claim 1, wherein at least a part of the at least one electrically conductive structure is arranged on the first and second side walls of the second electrically insulating core within the at least one plug recess.

8. The connector device according to claim 1, wherein the plug recess is a single recess.

9. A method of manufacturing a connector device for connection with a counter piece for establishing a mechanical and electric connection, the method comprising:

forming a first printed circuit board comprising a first electrically insulating core and an electrically conductive structure at least partially on a surface of the first electrically insulating core, wherein; the electrically conductive structure is configured for establishing the electric connection with the counter piece upon establishing the mechanical connection between the connector device and the counter piece; and forming a plug recess in a main surface of a second electrically insulating core of a second printed circuit board so that the second electrically insulating core has a first thickness in a region of the plug recess and a second thickness greater than the first thickness in a region surrounding the plug recess, wherein the region of the plug recess includes a first sidewall of the second electrically insulating core, a second sidewall of the second electrically insulating core, and a surface of the second electrically insulating core set back from the main surface and that connects the first sidewall and the second sidewall, and wherein the at least one plug recess is configured for establishing the mechanical connection with the counter piece; and directly connecting the first electrically insulating core to the second electrically insulating core so that the plug recess is circumferentially delimited by the surface of the first electrically insulating core, the first and second sidewalls of the second electrically insulating core and the surface of the second electrically insulating core that connects the first sidewall and the second sidewall, wherein the first electrically insulating core is unitary, and wherein the second electrically insulating core is unitary.

10. The method of claim 9, wherein the plug recess is formed by mechanically removing material of the second printed circuit board.

11. The method of claim 9, wherein the method further comprises:

patterning electrically conductive material on at least one main surface of the first printed circuit board;

singulating the first printed circuit board and the second printed circuit board with into a plurality of sections, each section constituting a connector device.

12. The method of claim 11, wherein the method further comprises forming a plurality of plug recesses before the singulation.

13. The method of claim 11, wherein the the first printed circuit board and the second printed circuit board are directly connected before singulating the stack into the plurality of sections.

* * * * *